United States Patent
Jung et al.

(10) Patent No.: US 7,205,089 B2
(45) Date of Patent: Apr. 17, 2007

(54) CROSS-LINKING POLYMER FOR ORGANIC ANTI-REFLECTIVE COATING, ORGANIC ANTI-REFLECTIVE COATING COMPOSITION COMPRISING THE SAME AND METHOD FOR FORMING PHOTORESIST PATTERN USING THE SAME

(75) Inventors: Jae-chang Jung, Seoul (KR); Cheol-Kyu Bok, Icheon (KR); Seung Chan Moon, Kyunggi-Do (KR); Ki-Soo Shin, Kyunggi-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 153 days.

(21) Appl. No.: 10/989,221

(22) Filed: Nov. 15, 2004

(65) Prior Publication Data

US 2005/0142481 A1 Jun. 30, 2005

(30) Foreign Application Priority Data

Dec. 24, 2003 (KR) .................. 10-2003-0096922

(51) Int. Cl.
| | |
|---|---|
| *G03C 1/835* | (2006.01) |
| *G03F 7/20* | (2006.01) |
| *G03F 7/30* | (2006.01) |
| *G03F 7/38* | (2006.01) |
| *C08F 16/34* | (2006.01) |

(52) U.S. Cl. .................. 430/270.1; 430/271.1; 430/18; 430/325; 430/326; 430/311; 430/319; 430/327; 430/330; 430/331; 525/328.7; 525/384

(58) Field of Classification Search .............. None
See application file for complete search history.

(56) References Cited

U.S. PATENT DOCUMENTS

| 6,338,934 | B1 | 1/2002 | Chen et al. |
| 6,395,451 | B1 | 5/2002 | Jung et al. |
| 6,818,380 | B2 * | 11/2004 | Maemori et al. ........ 430/270.1 |
| 6,871,656 | B2 * | 3/2005 | Mullee ................ 134/103.1 |
| 2005/0112497 | A1 * | 5/2005 | Jung ................ 430/270.1 |

\* cited by examiner

*Primary Examiner*—Sin Lee
(74) *Attorney, Agent, or Firm*—Marshall, Gerstein & Borun LLP

(57) ABSTRACT

A cross-linking polymer for an organic anti-reflective coating that is able to improve the uniformity of an ultra-fine photoresist pattern formed using a photolithography process and an ArF light source with 194 nm wavelength. Organic anti-reflective coatings including the same and a method for forming a photoresist pattern using the same are also disclosed. The disclosed cross-linking polymer is capable of preventing scattered reflection from a bottom film layer, eliminating standing wave effect due to alteration of thickness of the photoresist film, and increasing uniformity of the thickness of photoresist pattern. At the same time, the disclosed cross-linking pattern increases the etching velocity of the organic anti-reflective coating so that it can be easily removed.

15 Claims, 2 Drawing Sheets

CROSS-LINKING POLYMER FOR ORGANIC ANTI-REFLECTIVE COATING, ORGANIC ANTI-REFLECTIVE COATING COMPOSITION COMPRISING THE SAME AND METHOD FOR FORMING PHOTORESIST PATTERN USING THE SAME

BACKGROUND

1. Technical Field

Cross-linking polymers for organic anti-reflective coatings are disclosed that are able to improve the uniformity of a photoresist pattern having an ultra-fine pattern by photolithography with an ArF light source at a 194 nm wavelength. Organic anti-reflective coatings including the same and methods for forming a photoresist pattern using the same are also disclosed. More particularly, the disclosed cross-linking polymers make the organic anti-reflective coatings easy to remove, which prevents scattered reflection from the bottom film layer, they improve the uniformity of the thickness of the photoresist film and they eliminate the standing wave effect due to variations in the thickness of the photoresist film. At the same time, the disclosed cross-linking polymers increase the etching velocity of the organic anti-reflective coating thereby allowing the anti-reflective coating to be easily removed.

2. Description of the Related Art

In semiconductor production processes, an ultra-fine pattern formation process (hereinafter abbreviated as "the patterning method") necessarily involves standing waves in the photoresist film caused by variations of the optical properties of a bottom film layer and/or variations in the thickness of the photoresist film formed on the top portion of the bottom film layer. Other effects of the patterning method include reflective notching status and variation of critical dimension (hereinafter referred to as CD) of patterns of the photoresist induced by diffracted light and reflected light from the bottom film layer.

To address these problems, an intermediate film has been proposed in the form of a so-called anti-reflective coating, which can prevent diffused light reflection in the bottom film layer. The anti-reflection coating can be prepared by introducing a material having a higher light absorption in the bandwidth for the exposure light source. The anti-reflective coating is located between the bottom film layer and the photoresist. Such an anti-reflective film is generally divided into inorganic anti-reflective coatings and organic anti-reflective coatings, depending upon the different materials used in the coatings.

In recent years, organic anti-reflective coatings are applied in the ultra-fine pattern formation process and, thus, needs to satisfy the following requirements:

(1) After depositing the organic anti-reflective coating and coating a photoresist film on top portion thereof, the anti-reflective coating should resist being dissolved in the solvent for the photoresist. To accomplish this, the anti-reflective coating should have cross-linking structures. The cross-linking structures can be created during the lamination process which is followed by a baking process which inhibits the generation of other chemical materials as side products.

(2) In order to prevent scattered reflection from bottom film layer, the anti-reflective coating should contain certain materials to absorb light at the wavelength range of the exposure light source; and (3) Finally, the anti-reflective needs a catalyst to activate such cross-linking reaction in a process for laminating the anti-reflective coating composition.

In order to achieve these requirements, conventional organic anti-reflective coatings generally included a cross-linking agent to allow the anti-reflective coating to have a cross-linkage structure, a light absorbent agent to absorb the light at the wavelength range of exposure light source, and a thermal acid generator as a catalyst for activating the cross-linking reaction.

With respect to the ultra-fine pattern formation process of the photoresist using ArF light source with a 193 nm wavelength, a process has been proposed for producing an organic anti-reflective coating on bottom portion of a photoresist film that includes polyvinylphenol represented by the following Formula 1 as a light absorbent agent and, a polymer represented by the following Formula 2 wherein each of $R_1$ and $R_2$ is methyl group and $R_3$ is hydrogen as described in the document, Polymer 41 (2000) 6691–6694.

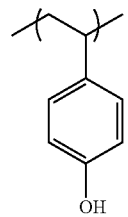

Formula 1

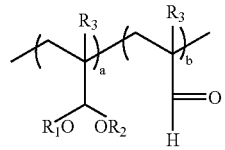

Formula 2

Using polyvinylphenol as the light absorbent agent in a conventional organic anti-reflective coating composition shows a higher absorbance to ArF light source having a 193 nm wavelength. The resulting coating can remove reflected light and standing wave on the bottom film layer and have cross-linkage bonds within the organic anti-reflective coating as well as the cross-linking agent represented by the above Formula 2.

However, when the anti-reflective coating was produced by using the conventional organic anti-reflective coating, a problem was found in that the composition showed a lower etching velocity which prevented removal of the anti-reflective coating under normal etching conditions. Due to such a low etching rate and velocity, an over-etching process was required to remove the anti-reflective coating which caused damage to the bottom film layer, thereby adversely affecting the reliability of the final product.

Accordingly, a strong demand exists for a novel organic anti-reflective coating and a composition of the same that can efficiently eliminate scattered reflection and standing waves in bottom film layer and, which also have an etching velocity and etching rate sufficient so that the coating can be easily removed under normal etching conditions.

SUMMARY OF THE DISCLOSURE

A cross-linking polymer for an organic anti-reflective coating is disclosed that provides an organic anti-reflective coating with a very high etching velocity.

An organic anti-reflective coating composition comprising the above cross-linking polymer and a method for forming a photoresist pattern using the same are also disclosed.

A disclosed method for forming photoresist pattern comprises: (a) coating disclosed organic anti-reflective coating composition on a top portion of a layer to be etched; (b) conducting a baking process to generate cross-linking bonds, thereby forming an organic anti-reflective coating; (c) applying a photoresist on a top portion of the organic anti-reflective coating, exposing and developing the photoresist to produce the desired photoresist pattern.

A semiconductor device produced by the disclosed patterning process is also disclosed.

BRIEF DESCRIPTION OF THE DRAWINGS

Other aspects of the disclosed cross-linking polymers, anti-reflection coating, patterning process and semiconductor devices will be apparent from the following description and examples with reference to the accompanying drawing wherein.

DETAILED DESCRIPTION OF THE PRESENTLY PREFERRED EMBODIMENTS

Figure 1:
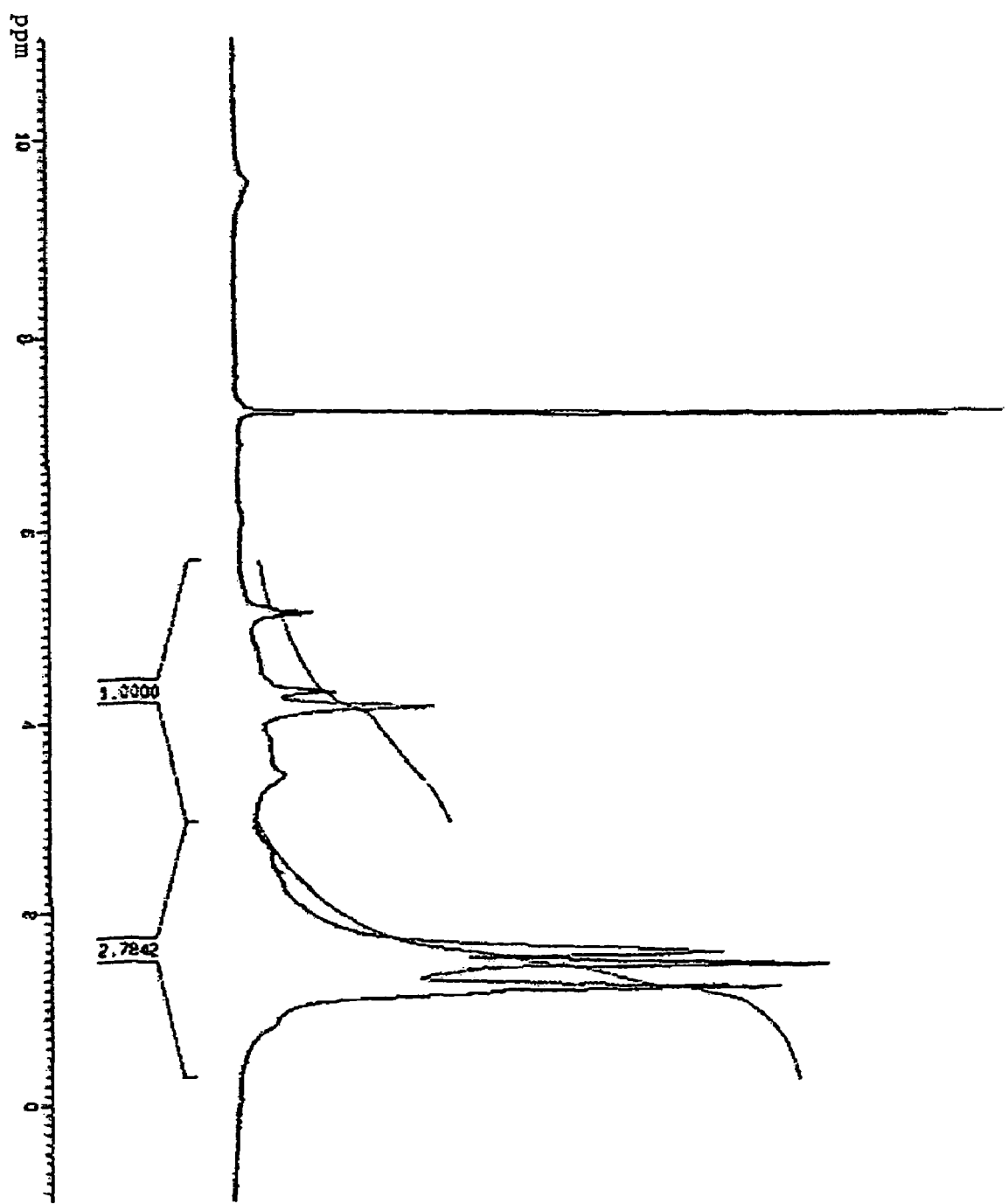
FIG. 1 illustrates a NMR spectrum of a disclosed cross-linking polymer.

A disclosed cross-linking polymer has the structure of Formula 3 and a weight average molecular weight in the range of 2,000 to 100,000.

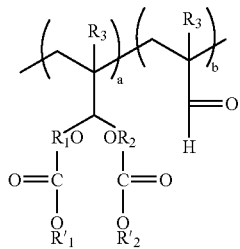

Formula 3 wherein each of $R_1$, $R_1'$, $R_2$ and $R_2'$ represents an alkyl group having branched chain or straight chain substituted $C_1$ to $C_{10}$; $R_3$ represents a hydrogen or a methyl group; and each of "a" and "b" represent a mole fraction of their respective monomers, "a" ranging from 0.9 to 0.99 and "b" ranging from 0.01 to 0.1.

In a disclosed cross-linking polymer, the alkyl group is substituted by ester group $R_1COOR_1'$ or $R_2COOR_2'$ wherein each of $R_1$, $R_1'$, $R_2$ and $R_2'$ represents an alkyl group having a branched chain or a straight chain substituted $C_1$ to $C_{10}$ so that the cross-linking polymer has an etching velocity faster than of conventional cross-linking polymers. Therefore, if the organic anti-reflective coating is produced with the disclosed cross-linking polymer, it is possible to improve the etching rate and the etching velocity for the organic anti-reflective coating and, at the same time, efficiently remove the reflected light and the standing waves from the bottom film layer.

As described above, the disclosed cross-linking polymers have a weight average molecular weight in the range of 2,000 to 100,000. If such molecular weight is less than the lower limit, the formed organic anti-reflective coating will not have a sufficient amount of cross-linking bonds generated and may be dissolved in a solvent for the photoresist. When the molecular weight is higher than 100,000, the organic anti-reflective coating has too many cross-linking bonds and may decrease the etching rate of the anti-reflective coating, thereby making it difficult to remove the organic anti-reflective coating under common etching conditions.

The disclosed cross-linking polymer is prepared by conducting a polymerization of acrolein or methacrolein in a presence of radical-polymerization initiator to obtain polyacrolein or polymethacrolein polymers, reacting the resultant material with ester based compound having a formula of $R_1(OH)COOR_1'$ or $R_2(OH)COOR_2'$ substituted by hydroxyl group, wherein each of $R_1$, $R_1'$, $R_2$ and $R_2'$ represents alkyl group having branched chain or straight chain substituted $C_1$ to $C_{10}$.

The above process for preparing the cross-linking polymer will be described in greater detail below.

First, acrolein or methacrolein is dissolved in an organic solvent. To that solution, a polymerization initiator is added followed by polymerization at 60 to 70° C. for 4 to 8 hours under a nitrogen atmosphere to produce polyacrolein or polymethacrolein. The resultant material reacts with any ester based compound having a formula of $R_1(OH)COOR_1'$ or $R_2(OH)COOR_2'$ substituted by hydroxyl group wherein each of $R_1$, $R_1'$, $R_2$ and $R_2'$ represents alkyl group having branched chain or straight chain substituted $C_1$ to $C_{10}$, at an ordinary or room temperature for 20 to 30 hours in the presence of p-toluene sulfonic acid catalyst. As a result, a cross-linking polymer having a structure of the above Formula 3 is provided.

The organic solvent used in such preparation method may include, but is not limited to, at least one selected from a group consisting of tetrahydrofuran (THF), cyclohexanone, dimethyl formamide, dimethyl sulfoxide, dioxane, methylethylketone, benzene, toluene and xylene mixtures thereof.

The polymerization initiator used in the above method preferably includes at least one material selected from a group consisting of 2,2'-azobisisobutyronitrile (AIBN), benzoyl peroxide, acetyl peroxide, lauryl peroxide, t-butyl peracetate, t-butyl hydroperoxide and di-t-butyl peroxide.

An organic anti-reflective coating is also disclosed which comprises: polyvinylphenol having the structure of Formula 1 as a light absorbent agent; a cross-linking polymer having a structure of Formula 3 and a weight average molecular weight in the range of 2,000 to 100,000; a thermal acid generator; and an organic solvent.

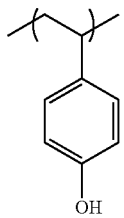

Formula 1

-continued

Formula 3

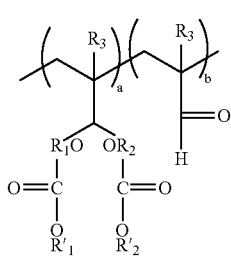

wherein each of $R_1$, $R_1'$, $R_2$ and $R_2'$ represents an alkyl group having branched chain or straight chain substituted $C_1$ to $C_{10}$; $R_3$ represents hydrogen or a methyl group; and each of "a" and "b" represent a mole fraction of their respective monomers, "a" ranging from 0.9 to 0.99 and "b" ranging from 0.01 to 0.1.

Briefly, one disclosed organic anti-reflective coating is characterized in that it includes the specified polymer of Formula 3 as the cross-linking agent. Such a cross-linking polymers is under an ester-substitution in place of an alkyl group replacing the acetal group in prior cross-linking polymers represented by Formula 2. In contrast to the conventional cross-linking polymers, the disclosed cross-linking polymers provide an increased etching velocity. Accordingly, the disclosed organic anti-reflective coatings can be efficiently removed with normal etching procedures. Further, the disclosed coatings can eliminate scattered reflection and standing waves on the bottom film layer by means of the polyvinylphenol polymer.

As illustrated in the examples that follow, the disclosed organic anti-reflective coatings have an etching velocity of about 1.25 times higher than conventional organic anti-reflective coatings.

The thermal acid generator used in the disclosed organic anti-reflective coating includes commonly known thermal acid generators and preferably comprises, but is not limited to, 2-hydroxyhexyl p-toluene sulfonate having a structure of the following Formula 4.

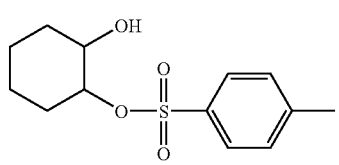

Formula 4

Such a thermal acid generator acts as a catalyst to activate cross-linkage reaction occurred between the cross-linking agent and the photo-absorbent agent within the organic anti-reflective coating composition and, then generates acid when a thermal process such as a baking process is carried out after applying the organic anti-reflective coating containing the thermal acid generator on a wafer. Sequentially, the cross-linking reaction occurs in the presence of such generated acid to form cross-linkage bonds, which render the organic anti-reflective coating insoluble in the solvent for the photoresist.

In addition, the disclosed organic anti-reflective coating further comprises a conventional organic solvent selected from the group consisting of ethyl 3-ethoxy propionate, methyl 3-methoxy propionate, cyclohexanone, propyleneglycol methylether acetate (PGMEA), etc., and mixtures thereof. The preferred solvent propyleneglycol methylether acetate.

The polyvinylphenol polymer of Formula 1 can be used as the light absorbent agent and may be present in an amount ranging from 20 to 200% by weight with respect to amount of the cross-linking polymer of Formula 3. The thermal acid generator is present in an amount ranging from 1 to 200% by weight relative to amount of the cross-linking polymer. Likewise, the organic solvent is present in an amount ranging from 1,000 to 10,000% by weight with respect to the total amount of the cross-linking polymer and the light absorbent agent.

By utilizing the above weight ratios, it is possible to efficiently prevent scattered reflection and the like on the bottom film layer of the photoresist and, at the same time, improve the etching rate and the etching velocity of the organic anti-reflective coating whereby easy and simple removal of the organic anti-reflective coating can be effected with general etching conditions after the patterning process.

A disclosed method for forming photoresist pattern comprises: (a) coating disclosed organic anti-reflective coating composition on a top portion of a layer to be etched; (b) conducting a baking process to generate cross-linking bonds, thereby forming an organic anti-reflective coating; (c) applying a photoresist on a top portion of the organic anti-reflective coating, exposing and developing the photoresist to produce the desired photoresist pattern.

Briefly, such a patterning method comprises using the disclosed organic anti-reflective coating composition to produce the photoresist pattern so that it can effectively eliminate scattered reflection and the like and, at the same time, the anti-reflective coating can be easily eliminated after formation of the pattern by way of the increased etching rate and etching velocity. Accordingly, it is possible to prevent damage of the bottom film layer by over-etching of the organic anti-reflective coating, which was one of the problems associated with the prior art.

In the disclosed patterning process, the baking process is preferably performed at a temperature ranging from 150 to 300° C. for a time period ranging from 1 to 5 minutes. By conducting the baking process under the above conditions, the thermal acid generator generates acid to form cross-linkage bonds in the anti-reflective coating, in turn, renders the anti-reflective coating insoluble in a solvent for the photoresist.

Additionally, the disclosed patterning process may further comprise an additional baking process before or after the exposure process among the steps mentioned above to form the pattern, which is preferably conducted at a temperature ranging from 70 to 200° C.

Although the disclosed anti-reflective coating and the disclosed patterning process are mostly adapted to ultra-fine patterns using ArF light source with 193 nm, they can be also applied to other ultra-fine patterns using KrF, DUV including EUV, E-beam, X-ray or ionic beam.

EXAMPLES

Example 1

Preparation of a Cross-Linking Polymer for an Organic Anti-Reflective Coating:

100 g of acrolein and 10 g of AIBN were poured in 500 g of tetrahydrofuran solvent then, subjected to a polymerization at 66° C. for 8 hours. In accordance with the polymerization, white solids created as the polymerization advances were filtered then dried after completion of the polymerization to result in 60 g of polyacrolein polymer.

Such apolyacrolein polymer was dissolved in an amount of 60 g in 1 liter of ethyl lactate. To this solution, added was 0.5 g of 2-hydroxyhexyl p-toluene sulfonate and followed by carrying out the reaction with a reflux at 90° C. It was observed that as the reaction advanced, the white solids dissolved into the ethyl lactate and changed in color resulting in a brown solution.

After completion of the reaction with the reflux for 24 hours, the reaction solution was concentrated by means of a rotary distillation device, filtered to generate a precipitate in 2 liters of distilled water, and dried under vacuum conditions. As a result, obtained was a weak brownish cross-linking polymer having a structure of Formula 5. FIG. 1 illustrates a NMR spectrum of the resultant cross-linking polymer.

Formula 5

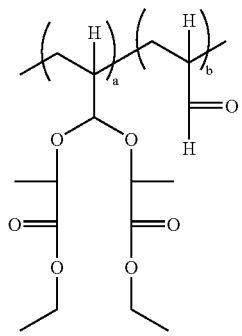

wherein "a" and "b" represent the mole percent of the respective monomers, "a" ranging from 0.9 to 0.99 and "b" ranging from 0.01 to 0.1.

Example 2

Preparation of an Organic Anti-Reflective Coating:

0.5 g of the cross-linking polymer with the above formula 5 obtained in Example 1, 0.5 g of the polyvinylphenol polymer with the formula 1 as the light absorbent agent, and 0.085 g of 2-hydroxyhexyl p-toluene sulfonate having a structure of Formula 4 as the thermal acid generator were dissolved together in 10 g of propyleneglycol methylether acetate. The obtained solution passed through a fine filter having a pore size of 0.2 μm to produce a desirable organic anti-reflective coating.

The resultant organic anti-reflective coating was spin-coated over a silicon wafer at 3000 rpm then subjected to the baking process for 90 seconds at 240° C. to generate cross-linkage bonds, in turn, to produce the organic anti-reflective coating.

Comparative Example 1

Preparation of a Prior Art Organic Anti-Reflective Coating:

0.5 g of the cross-linking polymer having a structure of the following formula 6, 0.5 g of the polyvinylphenol polymer with the formula 1 as the light absorbent agent, and 0.085 g of 2-hydroxyhexyl p-toluene sulfonate having a structure of the Formula 4 as the thermal acid generator were dissolved together in 10 g of propyleneglycol methylether acetate. The obtained solution passed through a fine filter having a pore size of 0.2 μm to produce the conventional organic anti-reflective coating composition.

The resultant organic anti-reflective coating composition was spin-coated over a silicon wafer at 3000 rpm then subjected to the baking process for 90 seconds at 240° C. to generate cross-linkage bonds, in turn, to produce the organic anti-reflective coating.

Formula 6

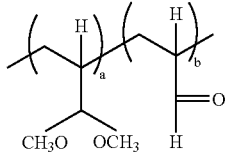

Experimental Example 1

Comparison Test of Etching Velocity:

Both the organic anti-reflective coatings obtained from Example 2 and Comparative Example 1 were subjected to a comparison test for etching velocity. The etching process was conducted in a dry-etching manner that uses a mixture consisting of $CF_4$, $O_2$ and Ar gases. By comparing the thickness etched for both of the organic anti-reflective coatings under the same conditions and for the same time period, the relative etching velocities of the above two coatings are obtained. The results are in Table 1.

TABLE 1

| | Thickness before etching (Å) | Thickness after etching (Å) | Thickness etched (Å) |
|---|---|---|---|
| Example 2 | 2980 | 1602 | 1375 |
| Comparative Example 1 | 3110 | 1400 | 1710 |

As shown in Table 1, the disclosed organic anti-reflective coating etching velocity of about 1.25 times higher than that of the prior art composition.

Experimental Example 2

Pattern Improvement Test:

On a wafer already coated with the disclosed organic anti-reflective coating, a photo-sensitive agent DHA 150 manufactured by Dong-Jin SemiChem Co., Ltd. for 193 nm wavelength was coated at a thickness of 0.241 μm, then treated by a baking process at 120° C. for 90 seconds. After conducting the baking process, an exposure process was carried out by an ArF scanner (NA=0.63) of ASML Co., Ltd. and followed by a further post-baking process at 120° C. for 90 seconds. After completion of the baking process, the baked product was put under a development process with 2.38% by weight of tetramethyl ammonium hydroxide (TMAH) solution to be developed to obtain a final photoresist pattern.

Figure 2:
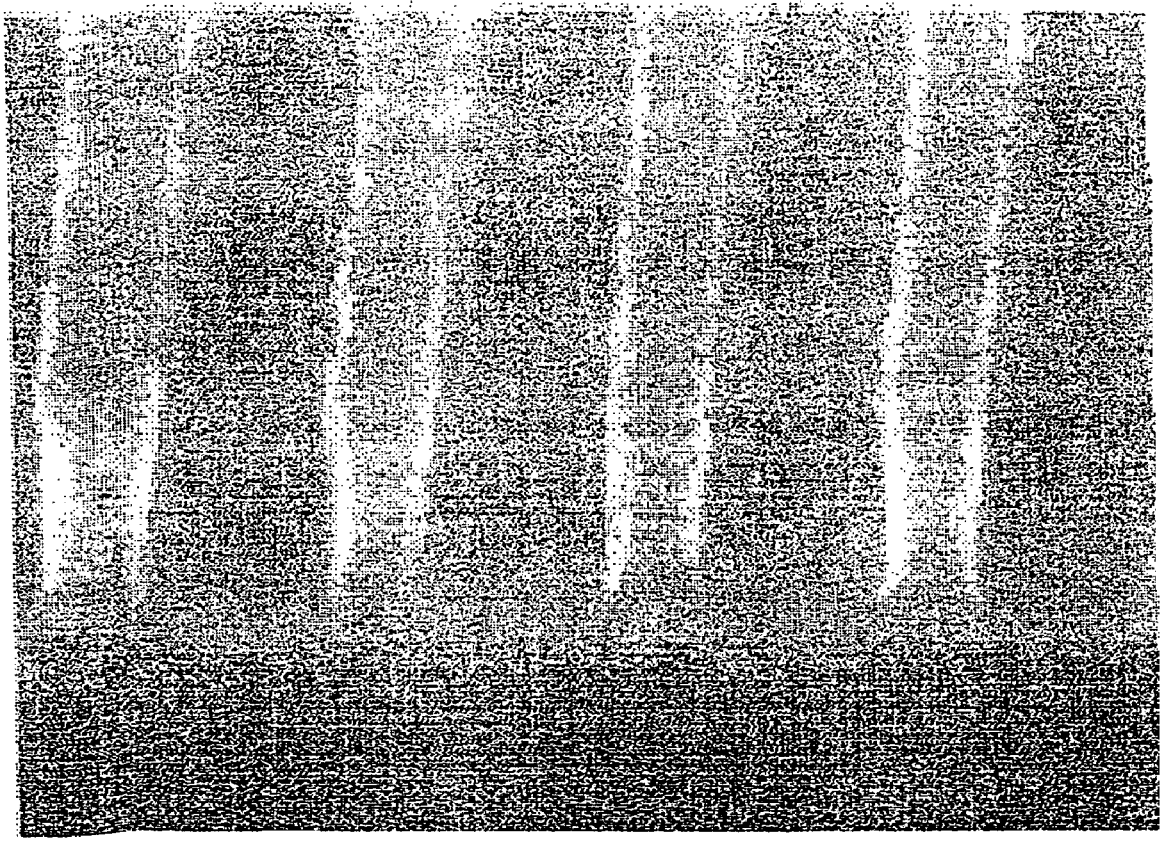
FIG. 2 is an electron microscopic photograph illustrating a pattern formed by a disclosed photoresist pattern formation process.

The photoresist pattern formed by the above method is illustrated in FIG. 2.

As described in Experimental Examples 1 and 2 and illustrated in the accompanying FIG. 2, it can be observed that the disclosed organic anti-reflective coatings have a sufficient light absorbance to 193 nm light source and the like and effectively remove scattered reflection, etc. from the bottom film layer. As a result, the disclosed anti-reflective coatings and pattering methods can provide an excellent perpendicular photoresist pattern and, at the same time, the organic anti-reflective coating is easily eliminated under general etching conditions because of the high etching velocity.

The disclosed novel cross-linking polymers are capable of increasing the etching velocity of the resultant organic anti-reflective coatings. By incorporating the disclosed cross-linking polymers, into the organic anti-reflective coatings. The organic anti-reflective coatings can efficiently remove scattered reflection, from the bottom film layer and, at the same time, the organic anti-reflective coating can be easily removed without over-etching, even under common etching conditions.

It is therefore possible to prevent scattered reflection and protecting the bottom layer from damage due to over-etching of the organic anti-reflective coating, thereby resulting an excellent perpendicular photoresist pattern.

This disclosure is not intended to be limited to the examples set forth above as numerous variations will be apparent to those skilled in the art. These variations are considered equivalent and within the spirit and scope of the appended claims.

What is claimed is:

1. A cross-linking polymer having a structure of Formula 3 and a weight average molecular weight in the range of 2,000 to 100,000;

Formula 3

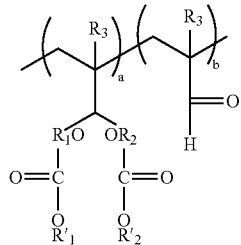

wherein each of $R_1$, $R_1'$, $R_2$ and $R_2'$ represents a $C_1$ to $C_{10}$ branched chain or straight chain alkyl group; $R_3$ represents a hydrogen or a methyl group; and each of "a" and "b" represent a mole fraction of the respective monomers, "a" ranging from 0.9 to 0.99 and "b" ranging from 0.01 to 0.1.

2. The cross-linking polymer of claim 1, wherein the cross-linking polymer has a structure of Formula 5;

Formula 5

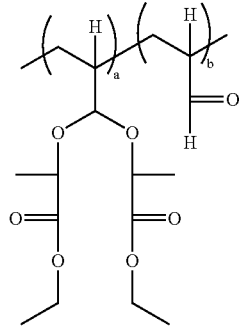

wherein each of "a" and "b" represent a mole fraction of the respective monomers, "a" ranging from 0.9 to 0.99 and "b" ranging from 0.01 to 0.1.

3. A method for preparing the cross-linking polymer of claim 1, comprising:
   (a) producing polyacrolein or polymethacrolein by dissolving acrolein or methacrolein respectively in an organic solvent, adding a polymerization initiator to the solution, and polymerizing the acrolein or methacrolein at 60 to 70° C. for 4 to 8 hours under vacuum conditions; and
   (b) reacting said polyacrolein or polymethacrolein with an ester based compound having a formula of $R_1(OH)COOR_1'$ or $R_2(OH)COOR_2'$ substituted by a hydroxyl group, at room temperature for 20 to 30 hours in the presence of a p-toluene sulfonic acid catalyst, wherein each of $R_1$, $R_1'$, $R_2$ and $R_2'$ represents a $C_1$ to $C_{10}$ branched chain or straight chain alkyl group.

4. The method of claim 3, wherein the organic solvent comprises at least one material selected from a group consisting of tetrahydrofuran (THF), cyclohexanone, dimethyl formamide, dimethyl sulfoxide, dioxane, methylethylketone, benzene, toluene, xylene and mixtures thereof.

5. The method of claim 3, wherein the polymerization initiator comprises at least one selected material from a group consisting of 2,2'-azobisisobutyronitrile (AIBN), benzoyl peroxide, acetyl peroxide, lauryl peroxide, t-butyl peracetate, t-butyl hydroperoxide, di-t-butyl peroxide and mixtures thereof.

6. An organic anti-reflective coating composition comprising:
   a polyvinylphenol having a structure of Formula 1 as a light absorbent agent;
   a cross-linking polymer having a structure of Formula 3;
   a thermal acid generator; and
   an organic solvent;

Formula 1

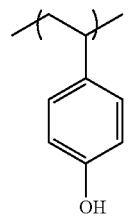

Formula 3

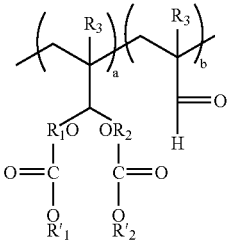

wherein, each of $R_1$, $R_1'$, $R_2$ and $R_2'$ is a $C_1$ to $C_{10}$ branched chain or a straight chain alkyl group; $R_3$ is hydrogen or methyl; and each of "a" and "b" are mole fractions of their respective monomers with "a" ranging from 0.9 to 0.99 and "b" ranging from 0.01 to 0.1.

7. The composition of claim 6, wherein the thermal acid generator comprises 2-hydroxycyclohexyl p-toluene sulfonate having a structure of Formula 4;

Formula 4

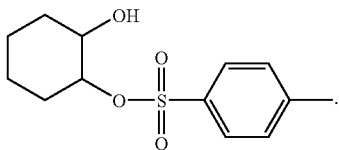

8. The composition of claim 6, wherein the light absorbent agent is present in an amount ranging from 50 to 200% by weight relative to the amount of the cross-linking polymer.

9. The composition of claim 7, wherein the thermal acid generator is present in an amount ranging from 10 to 200% by weight relative to the amount of the cross-linking polymer.

10. The composition of claim 6, wherein the organic solvent is present in an amount ranging from 1,000 to 10,000% by weight relative to the total amount of the cross-linking agent and the light absorbent agent.

11. A method for forming a photoresist pattern, comprising:
(a) coating the organic anti-reflective coating composition of claim 6 on top of a layer to be etched;
(b) conducting a baking process on the structure obtained from (a) to form cross-linking bonds in the organic anti-reflective coating;
(c) applying a photoresist on top of the organic anti-reflective coating; and
(d) exposing and developing the photoresist to produce a desirable photoresist pattern.

12. The method of claim 11, comprising performing the baking process at a temperature ranging from 150 to 300° C. for a time period ranging from 1 to 5 minutes.

13. The method of claim 11, further comprising an additional baking process before or after exposing the photoresist.

14. The method of claim 13, comprising performing the additional baking process at a temperature ranging from 70 to 200° C.

15. The method of claim 11, wherein the exposing and developing use a light source selected from the group consisting of $F_2$, ArF, KrF, DUV, EUV, E-beam, X-ray and ionic beam.

* * * * *